(12) United States Patent
Bayot

(10) Patent No.: US 7,032,807 B2
(45) Date of Patent: Apr. 25, 2006

(54) SOLDER CONTACT REWORKING USING A FLUX PLATE AND SQUEEGEE

(75) Inventor: Arthur Bayot, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 10/744,121

(22) Filed: Dec. 23, 2003

(65) Prior Publication Data

US 2005/0133573 A1   Jun. 23, 2005

(51) Int. Cl.
   *B23K 31/02* (2006.01)

(52) U.S. Cl. .................. 228/180.22; 228/207

(58) Field of Classification Search ............ 228/111.5, 228/223, 245, 246, 41, 33, 180.21, 207, 180.22, 228/221; 29/840
   See application file for complete search history.

(56) References Cited

U.S. PATENT DOCUMENTS

| | | | |
|---|---|---|---|
| 5,284,287 A | 2/1994 | Wilson et al. | |
| 5,439,162 A * | 8/1995 | George et al. | 228/180.22 |
| 5,872,399 A | 2/1999 | Lee | |
| 5,909,634 A | 6/1999 | Hotchkiss et al. | |
| 6,048,755 A | 4/2000 | Jiang et al. | |
| 6,146,920 A | 11/2000 | Inoue et al. | |
| 6,249,963 B1 | 6/2001 | Chou et al. | |
| 6,296,169 B1 | 10/2001 | Ong | |
| 6,355,101 B1 | 3/2002 | Kobayashi | |
| 6,518,089 B1 | 2/2003 | Coyle | |
| 6,527,041 B1 | 3/2003 | Farnworth | |
| 6,551,917 B1 | 4/2003 | Cobbley et al. | |
| 2002/0025602 A1 * | 2/2002 | Jiang et al. | 438/108 |
| 2002/0058406 A1 * | 5/2002 | Mukuno et al. | 438/626 |

FOREIGN PATENT DOCUMENTS

JP        407193097 A  *  7/1995

* cited by examiner

*Primary Examiner*—Kevin Kerns
*Assistant Examiner*—Michael Aboagye
(74) *Attorney, Agent, or Firm*—Yingsheng Tung; Wade James Brady, III; Frederick J. Telecky, Jr.

(57) ABSTRACT

Solder contacts can be formed on the conductive sites of a substrate by placing preformed solder balls on the conductive sites and then reflowing the solder balls to bond the solder balls to the conductive sites. After formation of the solder contacts, solder flux can be applied to at least a portion of the solder contacts. The solder contacts can then be reflowed to substantially improve the adhesion of the solder contacts to the conductive sites and increase the shear strength of the solder contacts.

18 Claims, 3 Drawing Sheets

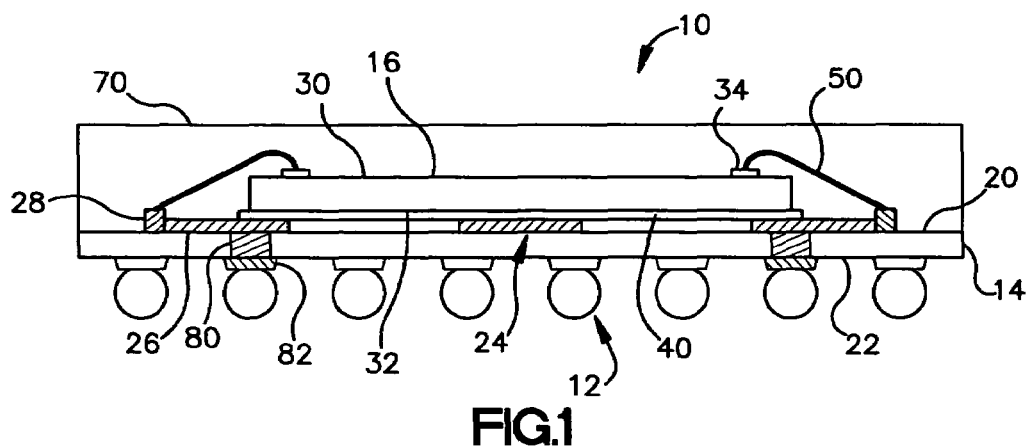
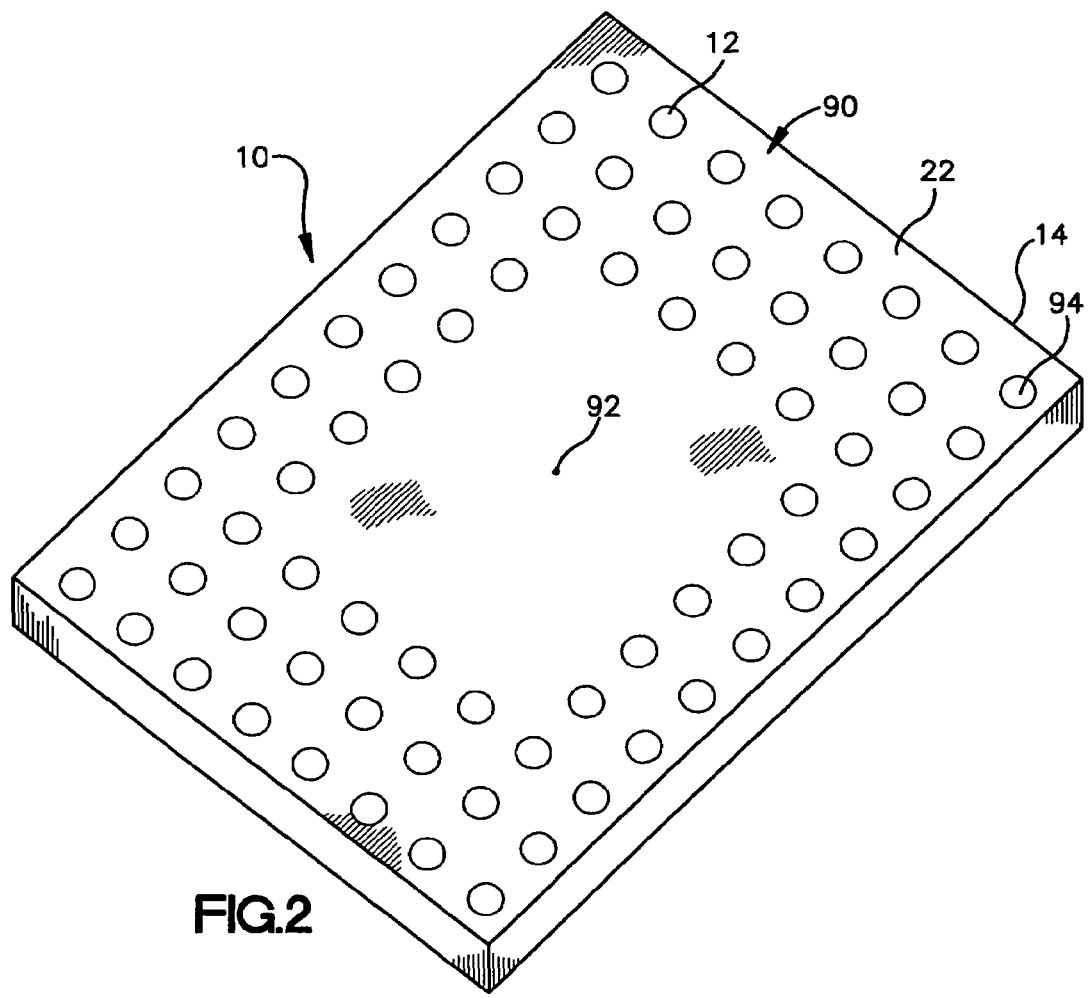

SOLDER CONTACT REWORKING USING A FLUX PLATE AND SQUEEGEE

TECHNICAL FIELD

The present invention relates generally to electronic device packaging and more particularly to a method and apparatus for forming solder contacts on a substrate of a semiconductor device.

BACKGROUND OF THE INVENTION

Modern electronic components utilize numerous integrated circuits. These integrated circuits can often be electrically connected to each other or to other electronic components. One method of connecting integrated circuits to electronic components utilizes an area array electronic package, such as a ball-grid array (BGA) package or a flip-chip package. With BGA packages, various input and output ports of an integrated circuit are typically connected by wire bonds to contact pads of a package substrate of the BGA package. Solder contacts formed on the contact pads of the BGA package are used to complete the connection to another electronic component, such as a printed circuit board (PCB).

Integrated circuits are also connected to electronic components through a flip-chip electronic package design. The flip-chip electronic package is similar to the BGA package in that solder contacts formed on contact pads of a package substrate are used to make a connection with other electronic components, such as a PCB. Solder contacts are also used in a flip-chip design to attach the input and output ports of a package substrate to the contact pads of the integrated circuit. Therefore, flip-chip packages do not require wire bonds. The solder contacts used to connect the input and output pads of the package substrate to the integrated circuit may be formed on the face of integrated circuits as they reside on semiconductor wafers before being sawed into individual dies.

Solder contacts can be formed using methods, such as printing of solder paste through a stencil or mask, electroplating, evaporation, and mechanical transfer of preformed solder ball or spheres. While electroplating, printing of solder paste through a stencil or mask, and evaporation techniques have been typically utilized for forming solder contacts on wafers and integrated circuits, BGA and chip-scale packages (CSP) have commonly utilized printing of solder paste and mechanical transfer of preformed solder balls to form solder contacts.

Transfer of preformed solder balls has been customarily achieved, by means of vacuum chucks or machined templates. Other methods for transferring preformed solder balls, can include arranging an array of solder balls on the tacky surface of a pressure sensitive tape, aligning the tape and solder balls over the contact pad, and thermally reflowing the solder balls.

Prior to attaching the solder balls to contact pads, solder flux can be applied to either the contact pad and/or the solder balls to facilitate the removal of any oxides or other layers of contamination that may prevent a good solder ball to contact pad adhesion. The solder flux also adheres the solder balls to the contact pads during reflow. Solder fluxes can contain organic based acids for removing the oxides. For conventional area array applications, such as flip-chip packages, PCB, and BGA packages, the solder flux can be applied directly to the contact pads of a substrate by forcing the flux through a screen or stencil. For effective screening oftentimes the flux must be pasty or very viscous. Alternatively, the flux can be applied to the contact pads of a substrate using a stamp system, a ball dip system, or a pin transfer system.

SUMMARY OF THE INVENTION

The present invention relates method of forming a plurality of solder contacts on conductive sites arrayed on a surface of a substrate. In the method, solder contacts can be formed on the conductive sites of the substrate by placing preformed solder balls on the conductive sites and then reflowing the solder balls to bond the solder balls to the conductive sites. Prior to placing the solder balls on the conductive sites of the substrate, solder flux can be applied to the solder balls and/or the conductive sites to facilitate formation of the solder contacts. After formation of the solder contacts, solder flux can be applied to the solder contacts to at least partially cover each solder contact with solder flux. The solder flux can be applied to the solder contacts using a pick-up apparatus that at least partially immerses the solder contacts in a substantially uniform layer of solder flux contained by a flux plate. The substantially uniform layer of solder flux can be formed using a squeegee. The solder contacts at least partially covered with the solder flux can then be reflowed to substantially improve the adhesion of the solder contacts to the conductive sites and increase the shear strength of the solder contacts to the conductive sites.

BRIEF DESCRIPTION OF THE DRAWINGS

The foregoing and other aspects of the present invention will become apparent to those skilled in the art to which the present invention relates upon reading the following description with reference to the accompanying drawings.

FIG. 1 illustrates a schematic cross-sectional view of a ball grid array (BGA) package in accordance with an aspect of the invention.

FIG. 2 illustrates a schematic perspective view of the solder contacts of the BGA package of FIG. 1.

DETAILED DESCRIPTION

Figure 3:
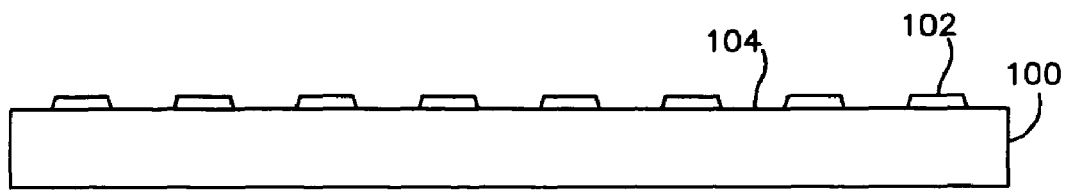
FIG. 3 illustrates a schematic cross-sectional view of a substrate with a plurality of contact pads.

The present invention comprises an improved method of forming a plurality of solder contacts arrayed on conductive sites of a surface of a substrate. The term "substrate" is used in a broad generic sense herein to include any semiconductor device including a wafer or a packaged or unpackaged bare die, as well as traditional substrates used in the formation of ball grid array (BGA) packages. The method of the present invention can be applied to the formation of solder contacts on any conductive site, whether the conductive site (e.g., a contact pad) projects from the substrate or is recessed therein. The terms "conductive site" and "contact pad" are used interchangeably herein to denote any site at which a solder contact can be formed.

The method of the present invention includes forming solder contacts on the contact pads of a substrate by placing preformed solder balls on the contacts pads and then reflowing the solder balls to bond the solder balls to the contact pads. After formation of the solder contacts, solder flux can be applied to the solder contacts to at least partially cover each solder contact with solder flux. The solder contacts at least partially covered with solder flux can then be reflowed to substantially improve the adhesion of the solder contacts to the contact pads and increase the shear strength of the solder contacts to the contact pads.

FIG. 1 is a cross-sectional view of a ball grid array (BGA) package 10 comprising a plurality of solder contacts 12 in accordance with an aspect of the present invention. The BGA package includes a package substrate 14 and a semiconductor chip 16 that is attached to the package substrate 14. The package substrate 14 can comprise an electrically insulative material, such as a flexible dielectric tape. The flexible dielectric tape can include a thermally stable polymer, such as a normal chain non-thermoplastic polyimide with a thickness in the range, for example, of about 15 μm to about 75 μm. It will be appreciated by one skilled in the art that other types of substrates can be used. For example, the substrate may be a rigid laminate comprising a bismaleimide-triazine resin (BT-resin), flame retardant fiberglass composite substrate board (e.g., FR-4), and/or a ceramic substrate material.

The package substrate 14 includes a first surface 20 for mounting the semiconductor chip 16 and a second surface 22 to which the solder contacts are attached. The package substrate 14 can be generally planar shaped and flat, such that the first surface 20 faces in an opposite direction with respect to the second surface 22. The package substrate 14 can, however, have other shapes. The package substrate 14 can also be a chip-scale package having dimensions, for example, within about 1.2 times the size of the semiconductor chip 16.

The package substrate 14 can include a conductive pattern 24 (e.g., copper pattern) comprising a plurality of conductive traces 26 and conductive terminals 28 that are formed on the chip mounting surface 20 (i.e., the first surface) of the package substrate 12. The conductive pattern 24 can be formed, for example, by etching a metal foil that can be formed over the mounting surface 20 of the package substrate 14. The metal foil can have a thickness, for example, between about 15 μm and about 40 μm. Examples of foil materials that can be used include copper, copper alloy, gold, silver, palladium, platinum, and stacked layers of nickel/gold and nickel/palladium. It will be appreciated that there may be other conductive traces within the package substrate 14. For example, the package substrate 14 may have multiple layers with conductive traces on multiple levels.

The semiconductor chip 16, which is attached to the first surface 20 of the package substrate 14, can have an active surface 30 and a passive surface 32. The active surface 30 can comprise one or more integrated circuits (not shown) and a plurality of conductive pads 34. The conductive pads 34 can be arranged about the periphery of the active surface 30 and provide electrical connecting points between the integrated circuits of the semiconductor chip 16 and the conductive terminals 28 on the package substrate 14. The semiconductor chip 16 can be formed from a semiconductor material, such as silicon, silicon germanium, gallium arsenide, or any other semiconductor material used in electronic device production. The thickness of the semiconductor chip 16 can be, for example, between about 200 microns and about 1000 microns. The integrated circuit can include product families, such as dynamic random access memory (DRAM), synchronous DRAM (SDRAM), static random access memories (SRAM), erasable programmable read memories (EPROM), logic circuits (LOGIC) digital signal processors (DSP), application-specific integrated circuits (ASIC), as well as other types of integrated circuit components.

The semiconductor chip 16 can bonded to the package substrate 14 with a die attaching material 40. The die attaching material 40 can include an epoxy, such as a conductive epoxy (e.g., silver filled epoxy or a silver filled glass epoxy). The semiconductor chip 16 can cover a substantial portion of the conductive pattern 24 formed on the mounting surface 20 of the package substrate. Conductive wires 50 can extend from the conductive pads 34 to the conductive terminals 28 of the conductive pattern 24. The conductive wires 50 can have a width of about 15 microns to about 32 microns and can comprise metals, such as gold, gold-beryllium alloy, copper, and aluminum.

A package material 70 encapsulates and protects the conductive wires 50 and the active surface 30 of the semiconductor chip 16 from damage and environmental influences. The package material 70 can also electrically insulate the semiconductor chip 16 from electrical components external the BGA package 10. The package material 70 can have a thickness, for example, of about 650 microns to about 800 microns and can form the shape of an upper portion of the BGA package 10. The package material 70 can comprise an electrically insulative molding compound, such as an epoxy based material used in transfer molding, as well as potting materials, such as cyanate ester-type resins, epoxies, polyesters, polyimides, and cyanocrylates. The package material 70 can be strengthened by organic as well as inorganic fillers. It will be appreciated that other package materials can also be used.

The conductive traces 26 of the conductive pattern 24 are electrically coupled to conductive vias 80. The conductive vias 80 extend through the package substrate 14 to an array of contact pads 82 that are formed on the surface 22 of the package substrate 14. The conductive vias 80 can be formed in package substrate 14 by drilling or punching holes through the substrate and subsequently plating or filling the holes with copper, nickel, gold, or other metal. The contact pads 82 can be formed on the surface 22 of the package substrate 14 by depositing (e.g., chemical vapor deposition (CVD), electroless or electrolytic plating) a layer of conductive material (e.g., copper), patterning the layer (e.g., photolithography techniques), and etching the conductive material. Although the contact pads 82 are illustrated as extending from the surface 22 of the package substrate 14, the contact pads 82 could be recessed in the package substrate 14.

The plurality of solder contacts 12 are formed on the contact pads 82. The solder contacts 12 can be used to form solder joints between the BGA package and a circuit board (e.g., printed circuit board (PCB)) (not shown) or an alternate level of interconnection. The solder contacts 12 can be arrayed on the surface 22 in a pattern consistent with industry standards. For example, FIG. 2 illustrates that the solder contacts 12 can be arrayed in a concentric pattern 90 relative to a center point 92 on the surface 22 of the package substrate 22. The concentric pattern 90 can comprise a rectangular array of solder contacts 12, arranged about the perimeter of the surface 22 of the package substrate 14. The area of the rectangular array can have dimensions of about 10 mm by 10 mm. It will be appreciated that the solder contacts 12 can be provided on the surface 22 in single array or in a plurality of arrays and that the area of the arrays can have dimensions between about 3 mm by about 3 mm and about 23 mm by about 23 mm.

Referring again to FIG. 1, the solder contacts 12 can be formed by bonding preformed solder balls to the contact pads 82. The term solder balls used herein does not imply that the solder balls are necessarily spherical. The solder balls can have various forms, such as semispherical, half-dome, truncated cone. The solder balls are usually small in diameter (e.g., about 0.3 mm to about 1.0 mm). The materials used to form the solder balls can include alloys of lead, tin, and sometimes indium or silver. It will be appreciated that other materials can also be used.

The solder balls can be bonded to the contact pads 82 by thermally reflowing the solder balls on the contact pads 82. Reflowing the solder balls causes the solder balls to at least partially melt and metalurgically bond with the contact pads 82. The reflowed solder balls (i.e., solder contacts 12) can have a substantially spherical or ball shape with a top surface 94 to which other devices (e.g., printed circuit board) can be attached and a bottom surface that is in contact with the contact pad. The exact shape of the solder contacts 12 can be a function of the deposition technique of the solder balls, reflow technique (e.g., infrared or radiant heat), and the material composition. Several measures can be used to achieve consistency of geometrical shape, such as controlling the amount of material and uniformity of the reflow temperature. Dependent on the composition, the reflow temperature can be in the range of about 150° C. to about 260° C.

Referring again to FIG. 2, the adherence of the solder contacts 12 to the contact pads 82 can be substantially improved by applying solder flux (not shown) to the top surfaces 94 of the solder contacts 12 and reflowing the solder contacts 12 after the formation of the solder contacts 12. The solder flux reduces the surface tension of the solder contacts 12 during reflow and affects the degree to which solder will reshape during reflow. A reduction in surface tension of the solder contacts 12 during reflow allows the solder contacts 12 to more readily form substantially spherical shapes.

FIGS. 3–10 illustrate a method of forming a plurality of conductive solder contacts on conductive sites on a surface of a substrate of a ball grid array package. It will be appreciated that although the following method is illustrated for forming the solder contacts on a substrate of a ball grid array package, the method can be used to form solder contacts on a wafer or a packaged or unpackaged bare semiconductor die.

Referring to FIG. 3, a substrate 100 of a ball grid array package is provided having a plurality of exposed contact pads 102 to which solder balls (not shown) are to be attached. The substrate 100 need not be restricted to a specific material. The substrate 100 can comprise a substantially planar sheet of insulative material, such as fiberglass (e.g., flame retardant fiberglass composite substrate board), polyimide tape (e.g., bismaleimide-triazine resin (BT-resin)), or ceramic. Alternatively, the substrate 100 can comprise a layer on a semiconductor die, such as silicon oxide (SiO), silicon nitride ($Si_3N_4$), polyimide, silicon dioxide ($SiO_2$), or some other insulative material formed on a die. It will be appreciated that other materials can be used to form the substrate 100.

The contact pads 102 can comprise a material that will form a metallurgical bond with the particular type of solder balls, which are to be attached. The contacts pad 102 can also be electrically connected to conductive vias (not shown) or conductive traces (not shown) that are formed either in and/or on the substrate 100. In one aspect of the invention, the contact pads 102 can be formed from a metal, for example copper, copper alloy, aluminum, aluminum alloy, tungsten, tungsten alloy, gold, silver, nickel, tin, platinum, iridium, or combinations of the foregoing. The contact pads 102 can be formed, for example, by depositing (e.g., CVD, electroless and electrolytic plating, and evaporation techniques) or laminating a layer metal on a surface 104 of the substrate 100. The contact pads 104 can then defined by patterning (e.g., lithography techniques) the metal layer and etching the metal layer. It will be appreciated that other methods can be used to form the contact pads 102. Moreover, it will be appreciated that, although the contacts pads 102 are illustrated as projecting from the surface 104 of the substrate 100, the contact pads 102 can be recessed in the surface 104.

Figure 4:
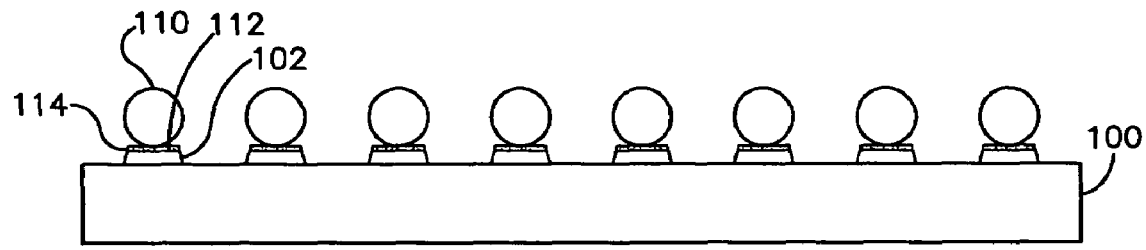
FIG. 4 illustrates a schematic cross-sectional view of the substrate of FIG. 2 after solder balls and solder flux has been placed on the contact pads of FIG. 3.

FIG. 4 illustrates a plurality of solder balls 110 can be adhered to surfaces 112 of respective the contact pads 102 using a solder flux 114. The solder balls 110 are substantially spherical and can have a diameter of about 0.3 mm to about 1.0 mm. Although the solder balls 110 are illustrated as being substantially spherical, the solder balls 100 can have various forms, such as semispherical, half-dome, and truncated cone. The materials used to form the solder balls 110 can include alloys of lead, tin, and sometimes indium or silver (e.g., 90/10 SnPb and 63/37 SnPb solder). It will be appreciated that other materials can also be used.

The solder flux 114 maintains the solder balls 110 in position on the surfaces 112 of the contact pads 102 before and during reflow or other processing of the solder balls 110 and the substrate 100. The solder flux 114 also cleans and prepares the surfaces 112 of the contact pads 102 so that a substantially metallurgical bond can be formed between the solder balls 110 and the contact pads 102. For example, the solder flux 110 can reduce or eliminate undesirable oxides or other undesirable materials on the surfaces 112 of the contact pads 102 to improve coupling of the solder balls 110. The solder flux 114 can include any type of flux 114 commonly used in solder ball connection in semiconductor processing. Examples of solder fluxes that can be used include rosin based fluxes (R-type), rosin mildly activated fluxes (RMA-type), rosin super activated fluxes (RSA-type) water-soluble type fluxes, and no-clean type fluxes. It will be appreciated that other flux chemistry systems can also be used and are within the scope of the invention.

The solder flux 114 can be provided directly on the contact pads 102 prior to placement of the solder balls 110 on the contact pads 102. For example, in one method, the solder flux 114 can be placed on the contact pads 102 using a stamping system (not shown). The stamping system can include a transfer head that has a projection portion and a plurality of projections that extend from the projection portion. The plurality of projections can be arranged on the projection portion to corresponds with (i.e., substantially match) the dimensions and spacing of the contacts pads 102 of the substrate 100. The plurality of projections are lowered into a layer of flux that is disposed in a flux tray, so that the flux adheres to the projections. After adhering the solder flux to the projections, the projections are pressed against the contact pads 102 to transfer the solder flux to the contact pads 102.

In another method, the solder flux 114 can be placed on the contact pads 102 using screen printing system (not shown). In a screen printing system, solder flux is applied to the contact pads 102 by forcing the flux through a screen or stencil. The screen comprises a metal mask that contains an array of holes that match the dimensions and spacing of the contact pads 102. The holes of the screen are aligned over the contact pads 102 and flux is forced through the holes using, for example, a squeegee. It will be appreciated that other methods can be used to place the solder flux 114 on the contact pads 102 prior to placing the solder balls 110.

Following placement of the solder flux 114 on the contact pads 102, the solder balls can be placed on the contact pads using various solder ball placement techniques. For example, in one technique, a pick-up tool (not shown) having a plurality of solder ball receiving cavities configured to match the arrangement of contact pads 102 on the substrate 100 is provided. Each cavity is coupled to a vacuum channel. A vacuum source can be connected to the pick-up tool such that a vacuum is pulled through the channel in order to hold a solder ball 110 in each cavity of the pick-up tool. The pick-up tool can be lowered toward a container, which holds an abundance of solder balls 110 and a vacuum can be pulled through the channel to draw a solder ball 110 into each cavity of the pick-up tool. Once the solder balls are arranged in the pick-up tool cavities, the pick-up tool positions the solder balls 110 on the contact pads 102 and the vacuum is released to allow the solder balls 110 to adhere to the solder flux 114 on the contact pads 102. It will be appreciated that other methods of placing the solder balls 110 on the contact pads can be used, such as screening the solder balls 110 through apertures of a template aligned over the contact pads or aligning the solder balls 110 on an adhesive tape to correspond with the contact pads 102 and pressing the adhesive tape to the substrate 100.

It will be further appreciated that the solder flux 112 can be provided on the solder balls 110 prior to placement of the solder balls 110 on the contact pads 102. For example, in one technique, a pick-up tool (not shown) having a plurality of solder ball receiving cavities configured to match the arrangement of the contact pads 102 on substrate 100 is provided. The pick-up tool is lowered toward a container, which holds an abundance of solder balls and a vacuum is pulled through a channel of the pick-up tool to draw a solder ball 110 into each cavity of the pick-up tool. Once the solder balls are arranged in the pick-up tool cavities, the pick-up tool positions solder balls 110 over a flux plate (not shown), which has a recess formed therein for containing solder flux. The pick-up tool then lowers the solder balls until each solder ball is partially immersed in the solder flux to a predetermined depth. The pick-up tool with the solder flux covered solder balls 110 is aligned over the contact pads 102, and the solder balls 110 are released from the pick-up tool so that the solder balls are adhered to the contact pads 102 with the solder flux 114.

Figure 5:
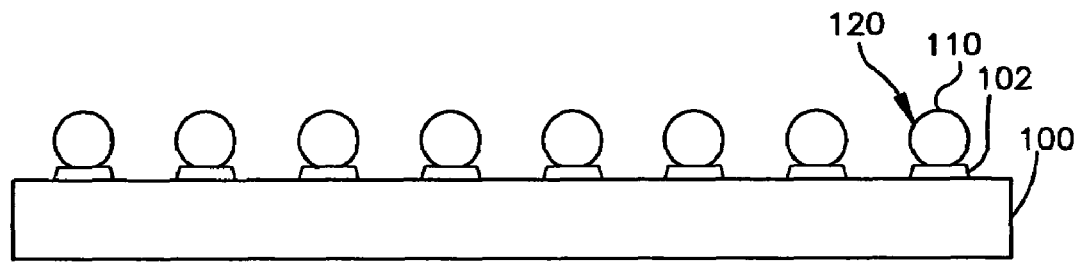
FIG. 5 illustrates a schematic cross-sectional view of the structure of FIG. 4 after the solder balls have been reflowed to form solder contacts.

FIG. 5 illustrates the solder balls 110 after a reflow or other thermal processing has been performed. The reflow process heats the solder balls 110 to the temperature above the melting temperature of solder balls to allow the solder balls to wet the contact pads 102 and metallurgically bond with the contact pads 102. Bonding of the solder balls 110 to the contact pads 102 forms a plurality of substantially spherical shaped solder contacts 120 with a top surface 132 to which other devices (e.g., printed circuit board) can be attached and a bottom surface that is in contact with the contact pad 102. It will be appreciated, that as a normal result of the reflow operation a portion of the solder ball 110 can flatten against the contact pads 102 so that solder contacts 120 are formed that are no longer substantially spherical. The reflow process can be performed in a nitrogen gas purged reflow oven that is maintained at temperature, for example, of about 150° C. to about 260° C. using radiant, convection, or an infrared heat source.

Figure 6:
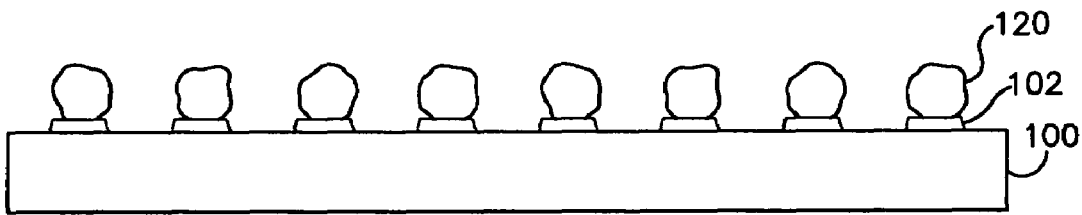
FIG. 6 illustrates a schematic cross-sectional view of the structure of FIG. 5 after at least some of the solder contacts have been deformed.

Following formation of the solder contacts 120 on the contacts pads 102, the substrate 100 of the BGA package can be subjected to testing, such as an electrical test and/or burn-in. In order to reliably test and/or burn-in the ball grid array package, the ball grid array package must be temporarily mounted in a socket (not shown), which provides interconnection between the solder contacts 120 and the outside circuitry. During the electrical testing or burn-in procedure, the solder contacts, as illustrated in FIG. 6, can potentially deform and in some cases the adherence of the solder contacts 120 to the contact pads 102 can be potentially reduced. The ball grid array package can also be subjected to other fabrication process after formation of the solder contacts 120 that can potentially deform the solder contacts 120 and/or reduce the adherence of the solder contacts to contact pads.

Figure 7:
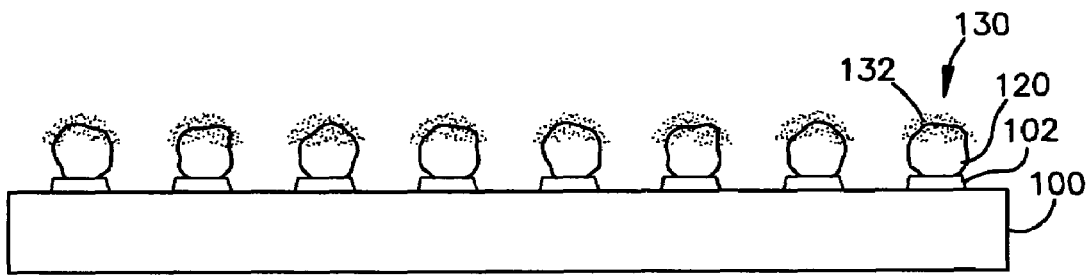
FIG. 7 illustrates a schematic cross-sectional view of the structure of FIG. 6 after solder flux has been placed on the solder contacts.

The deformed solder contacts 120 can be reformed into substantially spherical shapes to improve the adhesion between the solder contacts 120 and the contacts pads 102. FIG. 7 illustrates that solder flux 130 can be applied to the top surfaces 132 of the solder contacts 120 to facilitate reformation of the solder contacts 120. The solder flux 130 can reduce the surface tension of the solder contacts 120 during reflow and affect the degree to which the solder contacts 120 will reshape during reflow. A reduction in surface tension of the solder contacts 120 during reflow allows the solder contacts 120 to more readily form substantially spherical shapes. The solder flux 130 can also protect the molten solder from oxidation during reflow as well as substantially reduce and/or eliminate undesirable oxides or other undesirable material on the solder contacts 120. The solder flux 130 can include any type of flux commonly used in solder ball connection in semiconductor processing. Examples of fluxes that can be used include R-type fluxes, RMA-type fluxes, RSA-type fluxes, water-soluble type fluxes, and no-clean type fluxes. It will be appreciated that other flux chemistry systems can also be used and are within the scope of the invention.

Figure 8:
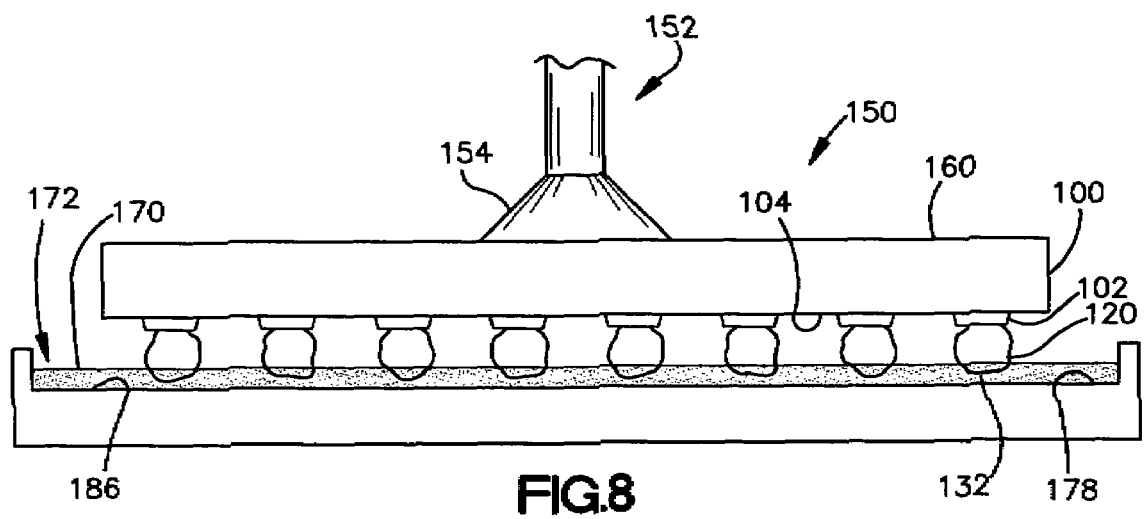
FIG. 8 illustrates a schematic cross-sectional view of the structure FIG. 6 being at least partially immersed in flux, which is contained in a flux plate.

FIG. 8 illustrates the solder flux 130 is provided on the top surfaces 132 of the solder contacts 120 using a dip system 150. The dip system 150 includes a vacuum pick-up apparatus 152 with a receiving end 154 for picking up the substrate 100. The receiving end 154 includes a cavity (not shown) that is coupled to a vacuum channel (not shown). A vacuum source (not shown) is connected to the pick-up tool such that a vacuum is pulled through the vacuum channel and cavity to hold a surface 160 of the substrate 100, opposite the surface 104 to which the solder contacts 120 are attached, against the receiving end 154.

The vacuum pick-up apparatus 152 is used to at least partially immerse the top surfaces 132 of the solder contacts 120 in a substantially uniform layer of solder flux 170.

Figure 9:
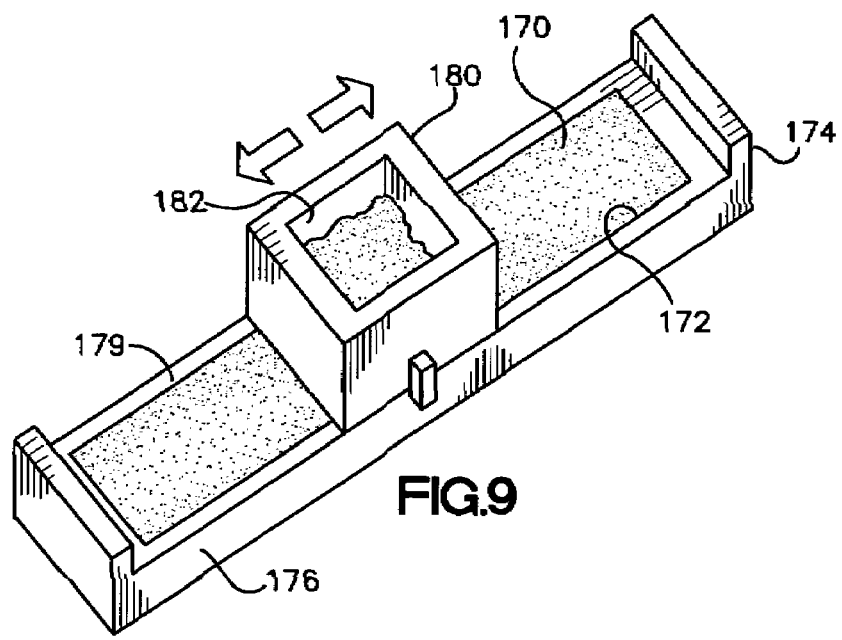
FIG. 9 illustrates a schematic perspective view of the flux plate of FIG. 8 and a manual squeegee.

Referring to FIG. 9, the substantially uniform layer solder flux 170 is provided by depositing solder flux in a recess 172 of a flux plate 174. The recess 172 is defined by a substantially rectangular sidewall 176 and a bottom surface 178 (FIG. 8) of the flux plate 174. The sidewall includes a substantially planar upper surface 179 that extends the length of the sidewall 176. The flux plate 174 can be manufactured in one piece of a single durable material, such stainless steel. In other embodiments, other materials can be used as long as such materials are durable and retain their intended physical characteristics after manufacture.

A squeegee 180 is positioned on the upper surface 179 of the sidewall 176 such that the squeegee 180 can slide along the length of the upper surface 179 of the sidewall 176 and over the recess 172. The squeegee 180 can comprise a relatively inflexible material (e.g., metal) or flexible material (e.g., rubber) and include an opening through which solder flux can be supplied to the recess 172 of the flux plate 174. The deposited solder flux can then be leveled or planarized by moving the squeegee 180 along the upper surface 179 of the sidewall 176 relative to the layer of solder flux 170.

Referring again to FIG. 8, the solder contacts 120 can be immersed in the layer of solder flux 170 to a depth that is substantially smaller than the total depth of layer of solder flux 170 so that the solder contacts 120 do not touch the bottom 186 of the recess 172, or in other words does not touch flux plate 174. The depth to which the solder contacts 120 are immersed should be optimized for the particular manufacturing process at hand. If the depth is too shallow, there may be an insufficient amount of solder flux on the top surface 132 of the solder contacts 120 to allow the solder contacts 120 during subsequent reflow to form substantially spherical shapes. On the other hand, if depth to which the solder contacts 120 are immersed is too deep, there is a risk that the solder flux will adhere to areas on the substrate 100 other than those occupied by the solder contacts 120. This will result in the substrate 100 having to be cleaned after the reflow process. A suitable immersion depth, for example, is approximately between 20% and 80% of the diameter of each solder contacts 120.

After the solder contacts 120 are properly immersed in the layer of solder flux 170, the pick-up apparatus 152 is raised and/or repositioned to remove the solder contacts 132 from the layer of solder flux 170. Solder flux 170 adheres to and extends over the top surfaces 132 of the solder contacts 120. The vacuum is released and the substrate 100 is then removed from the pick-up apparatus 152.

Referring to FIG. 7, the solder contacts 120 at least partially covered with the solder flux 130 are then reflowed or thermally processed to reform the solder contacts 120. The reflow process heats the solder contacts 120 to a temperature above the melting temperature of solder contacts 120 to allow the solder contacts to wet the contact pads 102 so that the metallurgical bond between the solder contacts 120 and the contact pads 102 is reformed. The reflow process can be performed in a nitrogen gas purged reflow oven that is maintained at temperature, for example, of about 150° C. to about 260° C.

Figure 10:
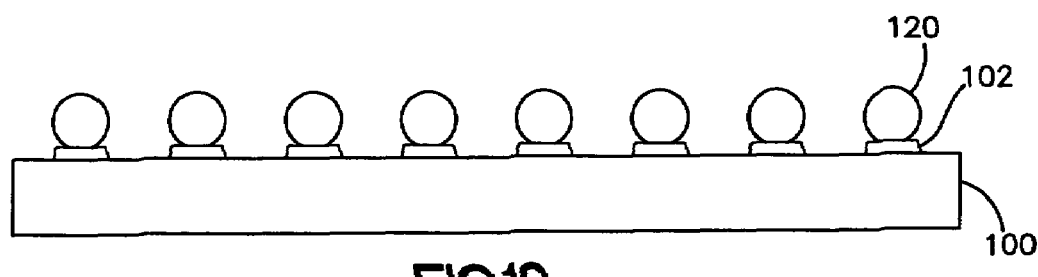
FIG. 10 illustrates a schematic cross-sectional view of the structure of FIG. 7 after the solder contacts have been reflowed.

FIG. 10 illustrates the solder contacts 120 after the reflow process has been performed. The reflowed solder contacts 120 have a substantially spherical shape and an improved sheer strength compared to solder contacts 120 that have not been reformed. The improved sheer strength can be at least in part attributed to the reduced surface tension of solder contacts 120 during reflow. The reduced surface tension results from the presence of solder flux on the solder contacts 120 during reflow. The reduced surface tension during reflow allows the solder contacts 120 to more readily wet the 112 surfaces of the contact pad 102 and form metallurgical bonds with the contact pads 102. Additionally, the reduced surface tension allows the solder contacts 120 more readily reshape to the substantially spherical shape.

Those skilled in the art will also understand and appreciate that variations in the processing operations can be utilized in the formation of the solder contacts in accordance with an aspect of the present invention. For example, it is to be appreciated that instead of forming the solder contacts on contact pads, the solder contacts could be formed on the terminus of a conductive via, a portion of a conductive trace, or a portion of a metal interconnect. Moreover, it will be appreciated the solder flux can be applied to the top surface of the solder contacts using other solder flux dispensing methods. For example, these other methods can include other solder flux dipping methods as well as other solder flux transfer methods.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming solder contacts on a substrate, the method comprising:
    providing a substrate having a plurality of conductive sites and a plurality of solder contacts, each solder contact including a top surface and a bottom surface, the bottom surface of each solder contact being connected to one of the plurality of conductive sites;
    at least partially immersing the plurality of solder contacts in a layer of solder flux in a solder flux plate with a recess to provide solder flux on each solder contact, the solder flux being supplied to the recess through an opening in a squeegee; and
    reflowing the solder contacts, which are provided with solder flux, to improve the adhesion of the solder contacts to the conductive sites.

2. The method of claim 1, the reflowed solder contacts each having a substantially spherical shape.

3. The method of claim 1, the at least partial immersion of the plurality of solder contacts further comprising:
    providing a pick-up apparatus having a receiving end to which a surface of the substrate is held;
    positioning the receiving end of the pick-up apparatus relative to the flux plate to at least partially immerse the solder contacts in the layer of solder flux.

4. The method of claim 3, further comprising using the squeegee to form a substantially uniform layer of solder flux.

5. The method of claim 4, the surface of the substrate being held to the receiving end of the apparatus by a vacuum.

6. The method of claim 1, the solder flux being provided on the top surfaces of the solder contacts.

7. The method of claim 1, the substrate comprising a portion of a ball grid array package.

8. A method of forming solder contacts on a substrate, the method comprising:
    providing a substrate having a plurality of conductive sites;

adhering a plurality of preformed solder balls to the plurality of conductive sites, such that each solder ball adheres to one of the plurality of conductive sites;

reflowing the plurality of solder balls to form a plurality solder contacts, each solder contact including a top surface and a bottom surface, the bottom surface of each solder contact being connected to one of the plurality of conductive sites;

at least partially immersing the plurality of solder contacts in a layer of solder flux in a solder flux plate with a recess to provide solder flux on each solder contact, the solder flux being supplied to the recess through an opening in a squeegee; and reflowing the solder contacts, which are provided with solder flux, to improve the adhesion of the solder contacts to the conductive sites.

9. The method of claim 8, the plurality of solder balls being adhered to the plurality of conductive sites with solder flux.

10. The method of claim 8, the reflowed solder contacts each having a substantially spherical shape.

11. The method of claim 8, the substrate comprising a portion of a ball grid array package.

12. The method of claim 8, the immersion of the top surfaces of the plurality of solder contacts further comprising:

providing a pick-up apparatus having a receiving end to which a surface of the substrate is held;

positioning the receiving end of the pick-up apparatus relative to the flux plate to immerse the solder contacts in the layer of solder flux.

13. The method of claim 12, further comprising using the squeegee to form a substantially uniform layer of solder flux.

14. The method of claim 13, the surface of the substrate being held to the receiving end of the apparatus by a vacuum.

15. A method for improving the adhesion of solder contacts on a substrate, the method comprising:

providing a flux plate including a recess containing a substantially uniform layer of solder flux supplied to the recess through an opening in a squeegee;

providing a substrate having a plurality of conductive sites and a plurality of solder contacts, each solder contact including a top surface and a bottom surface, the bottom surface of each solder contact being connected to one of the plurality of conductive sites;

at least partially immersing the plurality of solder contacts in the solder flux to provide solder flux on each solder contact; and reflowing the solder contacts, which are provided with the solder flux, to improve the adhesion of the solder contacts to the conductive sites.

16. The method of claim 15, the at least partial immersion of the plurality of solder contacts further comprising:

providing a pick-up apparatus having a receiving end to which a surface of the substrate is held;

positioning the receiving end of the pick-up apparatus relative to the flux plate to immerse the solder contacts in the substantially uniform layer of solder flux.

17. The method of claim 16, further comprising using the squeegee to form the substantially uniform layer of solder flux.

18. The method of claim 16, the surface of the substrate being held to the receiving end of the apparatus by a vacuum.

* * * * *